(12) United States Patent
Moore et al.

(10) Patent No.: US 6,246,816 B1
(45) Date of Patent: Jun. 12, 2001

(54) WAVELENGTH STABILIZED LASER LIGHT SOURCE

(75) Inventors: Gregory Scott Moore, Saugus; David Michael Rozelle, Woodland Hills; Ronald James Michal, Wrightwood, all of CA (US)

(73) Assignee: Litton Systems, Inc., Woodland Hills, CA (US)

( * ) Notice: Subject to any disclaimer, the term of this patent is extended or adjusted under 35 U.S.C. 154(b) by 0 days.

(21) Appl. No.: 09/364,492

(22) Filed: Jul. 30, 1999

(51) Int. Cl.[7] ................................................. G02B 6/34
(52) U.S. Cl. .................................................. 385/37
(58) Field of Search ............................... 385/37, 12, 24, 385/48; 356/345, 478, 141.3, 464; 250/227.19; 372/20, 13, 27; 33/286, 626

(56) References Cited

U.S. PATENT DOCUMENTS

| | | | |
|---|---|---|---|
| 4,566,220 | * 1/1986 | Hamar | 33/286 |
| 5,071,214 | * 12/1991 | Jacob et al. | 385/12 |
| 5,137,357 | * 8/1992 | Ferrar et al. | 356/464 |
| 5,170,225 | * 12/1992 | Ferrar et al. | 356/464 |
| 5,260,768 | 11/1993 | Cordova . | |
| 5,311,603 | 5/1994 | Fidric . | |
| 5,724,373 | * 3/1998 | Chang | 372/20 |
| 5,917,966 | * 6/1999 | Beuhler et al. | 385/12 |

* cited by examiner

Primary Examiner—Akm E. Ullah

(57) ABSTRACT

A wavelength stabilized light source is constructed using a lasing element such as a laser diode which generates light that is substantially polarized. This light is conducted through a polarization maintaining optic fiber to a Bragg grating which reflects a portion of the light back to the laser diode forming a virtual laser cavity and stabilizing the wavelength of the laser diode light output over time and a broad range of temperature and drive circuit conditions. To produce a broad band light source, the laser diode light is used to pump an erbium doped fiber. The wavelength stabilized light source can be used in fiber optic gyroscopes as well as in other applications that require a light source with a very stable wavelength.

20 Claims, 2 Drawing Sheets

WAVELENGTH STABILIZED LASER LIGHT SOURCE

BACKGROUND OF THE INVENTION

Many sensors and communications devices require a laser light source with a stable wavelength over time and over a broad temperature and drive current range. Fiber optic sensors, for example, use a broad band optic fiber light source, which requires a laser diode to pump the optic fiber light source and generate amplified stimulated emission (ASE). A sensor such as a fiber optic gyroscope requires a centroid (or average) wavelength of the ASE to be stable in order for the scale factor to be stable. When the conditions of drive current and temperature for the pump laser diode change, the peak wavelength of the laser diode light output also changes. This, in turn, causes the centroid wavelength of the ASE of the lasing optic fiber to change. While it is possible to model a large part of the changes in the centroid wavelength of the ASE as a function of the drive conditions for the laser diode, not all variations can be accurately modeled. In order to achieve a high accuracy fiber optic sensor, it is preferred to reduce the amount of the change in the wavelength to be modeled. The peak wavelength of the pump laser diode also can change with age. Individual pump laser diodes are affected by age to different degrees. Age is very difficult to correct with modeling so that it is difficult to produce a high accuracy fiber optic sensor that maintains its accuracy over time.

SUMMARY OF THE INVENTION

The present invention comprises a wavelength stabilized laser light source having a lasing element for generating substantially polarized light, a polarization maintaining optic fiber segment coupled to the lasing element for conducting the light generated by the lasing element and a wavelength selective reflector coupled to the polarization maintaining optic fiber segment. The wavelength selective reflector reflects a portion of the light generated by the lasing element back to the lasing element. Another fiber optic segment coupled to the wavelength selective reflector conducts a second portion of the light away from the lasing element. The lasing element is preferably a laser diode and the wavelength selective reflector is preferably a Bragg grating that reflects from 5% to 40% of the light received from the first fiber optic segment. This combination results in a light source that produces a stable wavelength of laser light over a broad temperature range and over a broad range of drive currents. It is also stable over time as the lasing element ages. The wavelength stabilized laser light source can be augmented with a fluorescing optic fiber to produce a stabilized broad band light source. The present invention can be used for fiber optic sensors, in amplifiers, to supply a communications signal or for a number of other purposes.

BRIEF DESCRIPTION OF THE DRAWINGS

The features and advantages of the present invention may be better understood by reference to the following detailed description, taken in consideration with the accompanying drawings of which.

DETAILED DESCRIPTION OF THE PREFERRED EMBODIMENTS

Figure 1:
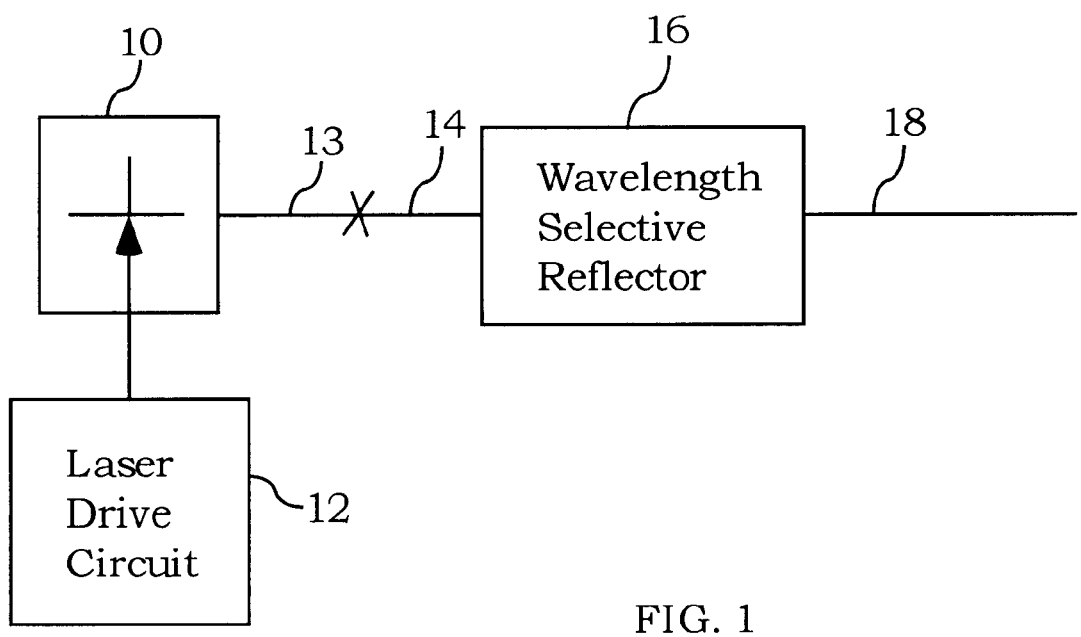
FIG. 1 is a diagram showing a wavelength stabilized laser light source according to the present invention.

FIG. 1 shows a diagram representing an exemplary wavelength stabilized light source according to the present invention as mentioned above. This light source can be used to supply pump light to an erbium doped optic fiber or for a number of other applications in which laser light with a stabilized wavelength is desired. The light source has a lasing element 10, for example, a laser diode. This laser diode is preferably a commonly available Fabry-Perot type semiconductor laser diode with an optic fiber pigtail 13. However, the present invention can be made with other lasing elements. The laser diode is driven by a conventional laser drive circuit, which is typically designed in order to provide a stable supply of power. As is well known in the art, the laser drive circuit may also be coupled to feedback control electronics (not shown) that measure output power or temperature and modify the drive current or supplied power accordingly. However, notwithstanding these efforts, the drive current from the laser drive circuit will typically vary significantly over a sufficiently broad range of temperatures.

The laser diode produces a highly polarized light output, typically greater than 10 dB polarization. The pigtail 13 is coupled to a segment of PM optic fiber 14, which is coupled to a wavelength selective reflector 16. While commonly available laser diodes are supplied with non-polarization maintaining (low birefringence) pigtails 13, it is preferred that a polarization maintaining (also called PM or polarization holding or high birefringence) optic fiber pigtail be used instead. If a non-polarization maintaining pigtail is used, it is preferred that the reflecting element be as close to the laser diode as possible. These practices will reduce the loss of polarization of the laser diode output and increase the wavelength stability of the light source. The greatest benefit is seen when the light reflected back to the lasing element has the same polarization state and orientation as the light emitted from the lasing element. Any loss in polarization or change in polarization will reduce the wavelength stability Preferably the reflector consists of a Bragg grating formed in an optic fiber core, however, a variety of other wavelength selective reflectors can be used instead, for example, a set of bulk optic mirrors with wavelength selective coatings. The grating is formed using a conventional technique in which the optic fiber is exposed to ultraviolet light, which is transmitted through a mask. The laser strikes the optic fiber in a pattern that is determined by the mask and alters the index of refraction of the optic fiber core in the sections through which the laser passes. This creates a series of index of refraction changes in the optic fiber core so that light travelling along the core traverses this series of index of refraction changes and responds as is well known in the art. The nature of the changes in the index of refraction can be adjusted to provide wavelength selectivity as well as to provide a desired amount of reflectivity and transmission.

The Bragg grating is preferably formed to create a reflectivity of between 5% and 40%. The portion of the light reflected back into the laser diode forms a virtual lasing cavity. This laser cavity effect locks the wavelength of the laser diode over a large range of environmental conditions. It also locks the wavelength as the laser diode ages. The larger the portion of light that is reflected back into the laser diode, the greater the laser cavity effect. However, in FIG. 1, a second optic fiber segment 18 extends from the Bragg grating to convey the wavelength stabilized light to its application. Greater reflectivity in the Bragg grating reduces the output of the light source and reduces its efficiency. The amount of reflection is preferably chosen to minimize reflection while still locking the wavelength of the light source.

In the preferred embodiment of the present invention, a laser diode was used that produced a 1465 to 1485 nm (nanometer) wavelength light output. The Bragg grating was formed specifically to reflect 30% of the 1477 nm light back to the laser diode. The effect of this was to virtually eliminate other modes of the laser diode and to stabilize the wavelength of the laser diode at 1477 nm to within 0.1% over a broad range of temperatures, specifically, the range of from −10 to 70 degrees degrees Celsius and a broad range of drive currents, specifically from 100 to 500 milliamps. When used in combination with the erbium doped fiber shown in FIG. 2, discussed below, the wavelength distribution of the broad band output of the erbium doped fiber was stable over the same temperature and drive current range to within 10 ppm (parts per million). Temperatures below −10 degrees Celsius can easily be accommodated with a heater. Performance at higher temperatures up to 85 degrees Celsius varied only slightly from that described herein.

Commonly available laser diodes are supplied with a low birefringence single mode (not PM) optic fiber pigtail. Bragg gratings are also typically formed on low birefringence single mode optic fiber. By forming the Bragg grating 16 on the same optic fiber 14 which is spliced to the laser diode pigtail 13, a splice can be eliminated. This reduces the losses that splices can cause. However, if the low birefringence optic fiber pigtail of the laser diode is spliced to another segment of low birefringence optic fiber, which includes the Bragg grating, then movement of either of the optic fibers or exposure to environmental changes, including temperature, will cause the polarization state of the light traversing through the fiber to change. If the reflected light from the Bragg grating is not in the same polarization state as the laser diode, then the output wavelength may not be locked. The preferred embodiment overcomes changes in polarization state using a laser diode with a PM fiber pigtail and by using a Bragg grating that is formed on PM fiber. For best effect, one of the axes of the PM fiber pigtail from the laser diode must be aligned to the peak polarization state of the laser diode, and one of the axes of the optic fiber containing the Bragg grating must be aligned along one of the axes of the PM fiber pigtail. Using PM fiber allows the Bragg grating to be located a significant distance away from the laser diode. This improves design freedom in systems that use the present invention. Alternatively, the PM fiber pigtail from the laser diode can be treated to form the Bragg grating directly on that pigtail.

While the present invention is described herein in a preferred embodiment using optic fiber to guide light between the various components, such as the lasing element and the reflector, this is not required. Other polarization maintaining waveguides can also be used. For example, the laser diode can be coupled directly to or fabricated upon a substrate, such as lithium niobate, that has been fabricated to contain a PM waveguide The PM waveguide can convey the light to bulk optics coated micro-mirrors that are also fabricated upon the same substrate. Discrete micro-channel waveguides can also be used to couple the light between components.

Figure 2:
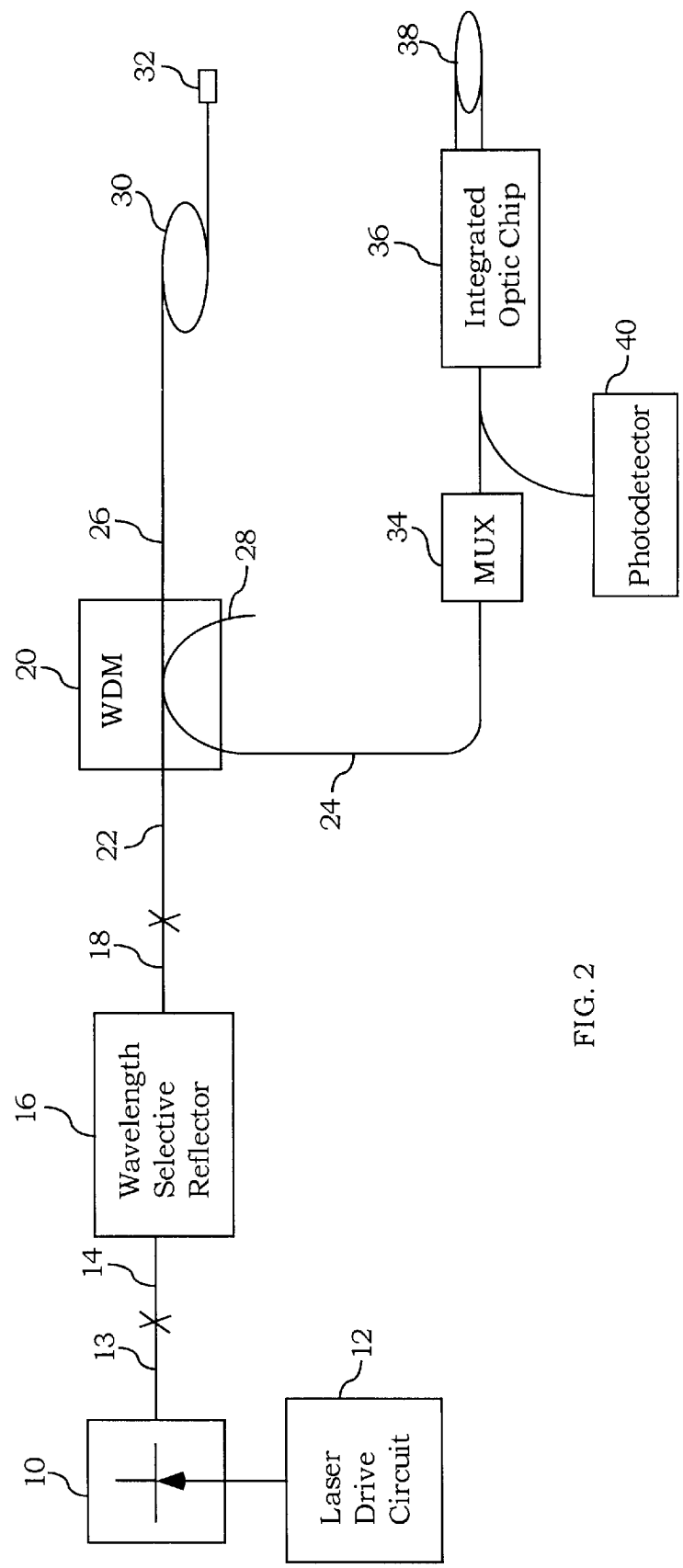
FIG. 2 is a diagram of a fiber optic gyroscope incorporating the light source of FIG. 1.

FIG. 2 shows an application of the wavelength stabilized light source of the present invention to a fiber optic gyroscope of the type shown in U.S. Pat. No. 5,260,768 to Cordova et al. entitled Fiber Optic Gyro with Low Birefringence and PM Fiber Networks and U.S. Pat. No. 5,311,603 to Fidric entitled Highly Efficient Superflourescent Fiber Laser/Amplifier for Interferometric Sensors, both of which are hereby incorporated herein by reference. FIG. 2 shows the laser diode 10 driven by the laser drive circuit 12 with a PM fiber pigtail 13 coupled to a Bragg grating 16 which is coupled to a second optic fiber segment 18. The second fiber segment may be a continuation of the first fiber segment or of the Bragg grating fiber segment. It may be comprised of PM fiber or, as is commonly done in fiber optic gyroscopes, this second segment may be comprised of low birefringence optic fiber. The second optic fiber segment is coupled to a wavelength division multiplexer (WDM) 20, which has two input leads, 22 and 24, and 2 output leads, 26 and 28.

One of the output leads 26 is coupled to a length of erbium doped optic fiber (EDF) 30. This length, typically about ten meters long, is formed into a coil and is terminated at one end with an angle capillary tube 32. The termination keeps light from being reflected from the terminated end of the coil back toward the coil. The EDF has a core that has been doped, as is well known in the art, such that when light of a specific wavelength, in the preferred embodiment 1477 nm, is launched into the core with enough intensity, spontaneous amplified stimulated emission (ASE) occurs across a broad band of wavelengths with a centroid at another wavelength, in this case 1560 nm. The ASE occurs in the EDF in both directions. EDFs that are pumped at 980 nm and other frequencies are also well known and can be used in the present invention with similar effect. The broad band output of the erbium doped fiber is particularly valued for fiber optic gyroscopes as discussed in the prior patents mentioned above.

The forward directed light exits the EDF through the angled capillary so that it cannot be reflected back into the optic fiber. This includes ASE light at 1560 nm and laser diode pump light at 1477 nm. This light is lost to the system. The reverse directed ASE light at 1560 nm is directed back toward the output port 26 of the WDM. The WDM has been optimized to separate the two wavelengths, 1477 and 1560 nm. ASE light from the EDF at 1560 nm is coupled to input 24, which in this case also acts as an output to the interferometric sensing coil. Any diode pump light at 1477 nm that is reflected back to the WDM at output port 26 is coupled to input port 22 and conveyed back toward the laser diode. The ASE light from the EDF is broad band and is coupled from output port 24 into a multiplexer 34 which is pigtailed to an integrated optic chip 36 that is connected to a sensor coil 38. Light from the integrated optic chip is directed to the sensor coil 38 in counter propagating directions, as is well known in the art, and is directed back through the integrated optic chip to a photo detector 40. Rotation is detected using electronics (not shown) in accordance with the Sagnac effect. The other output of the WDM 28 is terminated to prevent any light from being reflected toward the gyro sensor coil.

By providing a stable supply of pump light to the erbium-doped optic fiber, the broad band light output of the erbium doped optic fiber is also stabilized. This eliminates a substantial source of scale factor error in the rotation measurements of the fiber optic gyroscope when the Sagnac effect intensity variations are detected by the photo detector. Accordingly, the present invention can be implemented without the lasing fiber to produce a narrow band light. It can also be implemented with the lasing fiber to provide a wavelength stabilized broad band light.

While the wavelength stabilized laser light source has been shown in the context of a fiber optic gyro it can be used in any situation in which a laser light source is desired that produces a consistent wavelength over time or over a broad range of temperature and drive current conditions. Those skilled in the art will appreciate that various adaptations and modifications of the preferred embodiments described above can be made without departing from the spirit and scope of the present invention. Such adaptations and modifications include but are not limited to the following. The light wavelengths can be changed. Waveguides other than optic fiber can be used such as lithium niobate and micro-channel waveguides. The wavelength selective reflector can be moved closer or further away from or even integrated with the laser diode structure and the configuration of the fiber optic gyroscope, including the use of the WDM, can be greatly varied. Therefore it is to be understood that the invention may be practiced other than specifically described herein yet within the scope of the claims appended hereto.

What is claimed is:

1. A laser light source comprising:
   a lasing element for generating substantially polarized light;
   a polarization maintaining first waveguide segment coupled to the lasing element for conducting the light generated by the lasing element away from the lasing element;
   a wavelength selective reflector coupled to the polarization maintaining waveguide segment for reflecting a portion of the light generated by the lasing element back to the lasing element;
   a second waveguide segment coupled to the wavelength selective reflector for conducting a second portion of the light generated by the lasing element away from the lasing element.

2. The light source of claim 1 wherein the lasing element comprises an optic fiber pigtail to which the first waveguide segment is coupled.

3. The light source of claim 1 wherein the lasing element comprises a laser diode.

4. The light source of claim 3 wherein the laser diode comprises a Fabry-Perot type semiconductor laser diode.

5. The light source of claim 1 wherein the polarization maintaining waveguide segment comprises a polarization maintaining optic fiber.

6. The light source of claim 1 wherein the wavelength selective reflector comprises a Bragg grating.

7. The light source of claim 6 wherein the Bragg grating is formed in a segment of treated optic fiber through variations in the index of refraction of the optic fiber core.

8. The light source of claim 7 wherein the segment of treated optic fiber is spliced to the first waveguide segment and to the second waveguide segment.

9. The light source of claim 7 wherein the segment of treated optic fiber is formed in the same fiber as the first waveguide segment.

10. The light source of claim 1 wherein the wavelength selective reflector reflects from five to forty percent of the light received from the first waveguide segment back to the lasing element.

11. The light source of claim 1 further comprising a segment of lasing optic fiber coupled to the second waveguide segment for producing broad band light in response to the light generated by the lasing element.

12. The light source of claim 11 wherein the segment of lasing optic fiber comprises erbium doped optic fiber.

13. The light source of claim 12 wherein the broad band light is centered at a different wavelength from the lasing element light and wherein the lasing optic fiber is coupled to the second waveguide segment through a wavelength dependent multiplexer for routing the lasing element light to the lasing optic fiber and for routing broad band light away from the lasing element.

14. An interferometric optical sensor comprising the light source of claim 1 and further comprising:
   a segment of lasing optic fiber coupled to the second waveguide segment for producing broad band light in response to the light generated by the lasing element;
   a splitter for dividing the broad band light into two portions;
   a coil of optic fiber for receiving the two portions of broad band light, and for propagating one portion in a clockwise direction and the other portion in a counterclockwise direction; and
   a photodetector for receiving the propagated light and measuring it to determine a rate of rotation.

15. The optical sensor of claim 14 wherein the lasing element comprises a pump laser diode, the first waveguide segment comprises a polarization maintaining optic fiber, the wavelength selective reflector comprises a Bragg grating formed in a polarization maintaining optical fiber and the segment of lasing optical fiber comprises erbium doped optic fiber.

16. The optical sensor of claim 15 wherein the pump laser diode further comprises a fiber pigtail and the polarization maintaining optic fiber is spliced to the pump laser diode pigtail and wherein the Bragg grating is formed in the polarization maintaining optic fiber.

17. The optical sensor of claim 14 wherein the splitter comprises an integrated optic chip and wherein the second waveguide segment, the segment of lasing optic fiber and the integrated optic chip are coupled together with a wavelength dependent multiplexer.

18. A laser light source comprising:
   means for generating substantially polarized light;
   means coupled to the generating means for conducting the light from the generating means and for maintaining the polarization of the generated light;
   means for reflecting a first portion of selected wavelengths of the light generated by the generating means back to the generating means, the reflecting means being coupled to the conducting means;
   second means for conducting a second portion of the light generated by the generating means away from the generating means, the second conducting means being coupled to the reflecting means.

19. The light source of claim 18 further comprising means for producing broad band light through amplified stimulated emission in response to the substantially polarized light, the producing means being coupled to the second conducting means for receiving the substantially polarized light.

20. An interferometric optical sensor comprising the light source of claim 19 and further comprising:
   means for propogating the broad band light in two portions one portion propagating in a clockwise direction and the other portion propagating in a counterclockwise direction;
   means for recombining the two broad band light portions after propogation; and
   means for detecting the intensity of the recombined light portions and determining a rotation rate therefrom.

* * * * *